United States Patent [19]

Ciparisso

[11] Patent Number: 4,817,559
[45] Date of Patent: Apr. 4, 1989

[54] VACUUM VAPOR-DEPOSITION APPARATUS FOR COATING AN OPTICAL SUBSTRATE

[75] Inventor: Delio Ciparisso, Ascona, Switzerland
[73] Assignee: Satis Vacuum AG, Zurich, Switzerland
[21] Appl. No.: 79,824
[22] Filed: Jul. 30, 1987
[30] Foreign Application Priority Data
Jul. 31, 1986 [CH] Switzerland ............... 03080/86
[51] Int. Cl.⁴ ............................................. C23C 16/44
[52] U.S. Cl. ..................................... 118/731; 118/503
[58] Field of Search .................... 118/730, 731, 503
[56] References Cited
U.S. PATENT DOCUMENTS
3,799,110 3/1974 Bellmann ........................... 118/731
3,859,956 1/1975 Paola ................................. 118/720

*Primary Examiner*—Evan Lawrence
*Attorney, Agent, or Firm*—Herbert Dubno

[57] ABSTRACT

The cup like support of a vacuum vapor deposition apparatus for substrates to be coated comprises a plurality of pivotable support plates each with a plurality of openings for substrate holders. The substrate holders can have a frame partially embracing the substrate received in it in which the substrate sits acted on by a retaining spring and which is attached to the support plate freely tiltable on both sides about a tilting axle. Alternatively at least one of the substrate holders is tiltable and each of the remaining holders is nontiltable having a gripping arm attached at its inner end to a tension providing spring at the edge of an opening in the support plate which is covered by a pair of circular plates. Because of these features a nearly complete fit of the shape of the support to the ideal shape of a cup can be attained by the freely tiltable substrate holders which tilt from the support plate plane to a predetermined angle. Thus a more uniform coating on both sides of all the substrates is produced.

6 Claims, 2 Drawing Sheets

VACUUM VAPOR-DEPOSITION APPARATUS FOR COATING AN OPTICAL SUBSTRATE

FIELD OF THE INVENTION

My present invention relates to an apparatus for coating a plurality of objects with a vapor in vacuo and, more particularly, to an apparatus for vacuum vapor deposition of a coating on a plurality of optical substrates such as plastic spectacle lenses.

BACKGROUND OF THE INVENTION

A vacuum vapor deposition apparatus for coating a plurality of optical substrates such as plastic spectacle lenses (e.g. for sunglasses) which are distributed on a support means which rotates in an evacuable container above at least one vapor source is known.

This vacuum vapor deposition apparatus is of great significance today because it can produce a reflection-reducing coating on a plastic spectacle glass, lens and-/or the like. The problem with this method is that as many glasses or lenses as possible must be coated in the same vacuum cycle since the idle time between the individual cycles is comparatively high.

The so-called cups have proved suitable support means for the optical substrates. They extend dome-like and rotatably in the upper portion of the container and have a plurality of mounting openings (e.g. 36) for receipt of the optical substrates distributed over the cup-like surface. The empirically determined curvature of the cup-like surface guarantees that all substrate surfaces to be coated take an optimum angular position relative to the vacuum source so that a uniform coating or layering occurs on all substrates.

Holders mounted on the periphery of a rotating table have also been proposed as support means. These support means are pivotable by pivot means about 180° so that twice the number of substrate surfaces as previously can be coated in a single cycle. However no greater output can be attained with the same peripheral space in the container since only a limited number of holders can be placed on the rotatable table peripherally. Also such an arrangement is very expensive and uneconomical.

OBJECTS OF THE INVENTION

It is an object of my invention to provide an improved vacuum vapor deposition apparatus for coating an optical substrate.

It is also an object of my invention to provide an improved vacuum vapor deposition apparatus for coating an optical substrate in which the advantage of a cup-like support means for the substrates is combined with pivotability of the support means to double the number of substrate surfaces coated in a single vacuum cycle.

SUMMARY OF THE INVENTION

These objects and others which will become more readily apparent hereinafter are attained in accordance with my invention in a vacuum vapor deposition apparatus for coating a plurality of optical substrates such as plastic spectacle lenses which are distributed on a support means which rotates in an evacuable container above at least one vapor source.

According to my invention the support means includes a plurality of at least approximately circular segmental flat support plates which are positionable relative to one another so that a cup-like structure is formed. The support plates are each supported on a common rotating axle so as to be pivotable about 180°. Each of these support plates have a plurality of substrate holders provided in openings with at least one retaining or tension providing spring. At least one of the substrate holders is tiltable freely to opposite sides out of the plane of the support plate to a predetermined angle.

By using flat circular segment-like support plates in a cup-like arrangement practically the same number of substrates can be coated in a container of the same size as when a cup mounting is used. Furthermore since the individual support plates can, in accordance with the invention, pivot, twice as many substrate surfaces as before can be coated in the same vacuum cycle. Thus an almost complete fit to the ideal shape of the cup is attained when the substrate holders are freely tiltable from the plane of the support plates to a predetermined angle and thus a uniform coating on both sides of all substrates is attained.

A very simple, strong and reliable construction is attained when each freely tiltable substrate holder has a frame partially embracing one of the substrates received in it and in which the substrate sits acted on by the retaining spring and which is mounted freely tiltable to both of its sides in the support plate on a tilting axle. Furthermore advantageously the frame cooperates or acts together with adjustable stop elements on the support plate on both of its sides which limit or bound the tilting angle.

The support plate is pivotable in a reliable and simple way when each of the support plates is supported in the vicinity of its lower edge or rim on a ring rotating with the rotating axle and supports a pivot cam means on that lower edge which cooperates with a positioning pin temporarily movable into the rotating region of the support plate.

Advantageously each nontiltable substrate holder for support of the substrate includes a certain edge region of the opening of the support plate on which the substrate sits acted on by a grip arm acted on by a tension providing spring. The tension providing retaining spring engaged on an inner end of the grip arm is a spiral spring braced on the support plate which is covered on both sides by a circular plate whereby an effective covering of the spiral spring means which prevents it being coated by the vapor source and thus an increased reliability is attained.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1:
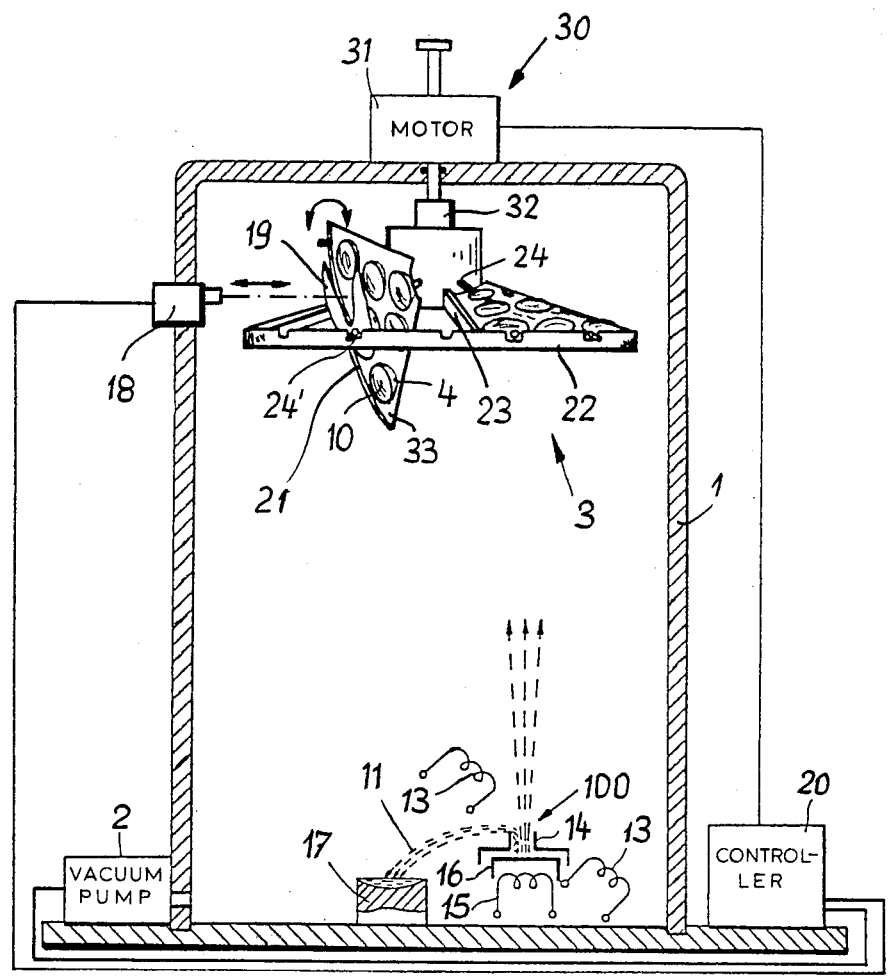
FIG. 1 is a schematic simplified partially cross sectional, partially perspective view of a vacuum vapor disposition apparatus for coating a plurality of optical substrates simultaneously.

The vacuum vapor deposition apparatus illustrated in FIG. 1 for deposition of a coating on a plurality of optical substrates, particularly plastic lenses or spectacle lenses, comprises a container 1 evacuable by a vacuum pump 2, support means 3 for mounting a plurality of substrates 10 in openings 4 of the support means 3. The support means 3 is located in the upper portion of this container 1 as is illustrated in more detail below.

The lower portion of this container 1 is provided with a vapor source 100 (or a plurality of vapor sources) which here comprises an electron beam gun with a heated filament 15 whose electrons are directed in a beam into a focusing unit 16 after heating.

For example the electron beam 11 can be produced by a tungsten cathode at a high negative potential and focused with a Whenelt cylinder or control grid.

This electron beam 11 may be guided by magnetic guide means 13 into a crucible 17 in which the vapor deposition material is located.

An oscillatory and/or rotating motion can be imparted to the beam 11 by additional magnetic field generating means 14 to scan the entire crucible surface with the electron beam 11.

Devices with operable components which enter the vacuum chamber 1 from the outside-like the rotating mechanism 30 with the motor 31 and the rotating axle 32 for the support means 3 are necessary to operate and/or serve the unit's parts to be moved in the evacuate container 1. All these means are controllable in the usual way by controlling member 20.

The basic structure and construction of a vacuum vapor deposition apparatus as far as the ion beam or electron beam evaporated is known so that a detailed description of the construction and conventional features of the vacuum vapor deposition apparatus according to my invention need not be carried out in exhaustive detail.

According to my invention the support means 3 comprises a plurality, here six, of circular segment-shaped flat support plates 33 which have approximately circular arc-like edges. These support plates 33 receive a spectacle lens 10 in each of six openings 4. The substrate holder 6 or 7 is provided for each of these lenses 10.

These support plates 33 as can be seen in FIG. 1 are mounted to form a cup-shaped unit and rotate about the rotating axle 32, each pivotable about 180°. The support plates 33 are supported by pivot pins 24 and/or 24' on one side on the free interior end of the rotating axle 32 forming the wheel hub and on the other side adjacent its lower edge or rim 21 on a ring 22 rotating with the rotating axle 32. This ring 22 is similarly attached rotatably in a spoked wheel by radial bars or spokes 23 for which the rotating axle 32 forms the hub. Each support plate 33 is located between two neighboring spokes or radial bars 23.

For pivoting each of the support plates 33 a pivot cam means 19 in the form of a reversing fork is positioned adjacent the lower edge portion or rim 21. This reversing fork cooperates with a positioning pin 18 mounted in the vicinity of a wall of the container 1 since the positioning pin 18 temporarily may move in the vicinity of the rotating region of the support plate 33 and/or its pivot cam means 19. The positioning pin 18 can be operable electromagnetically or hydraulically or pneumatically and is controllable by controlling member 20.

This apparatus is functionally reliable and user friendly as far as maintenance goes because of its simple concept.

The support plates 33 with their pivot pins 24 and/or 24' are appropriately mounted on the rotating axle 32 and the ring 22 only in an open pivoting shell or cup for easy removal of the support plates for equipping (with spectacles lenses) and/or for easy mounting.

Figure 4:
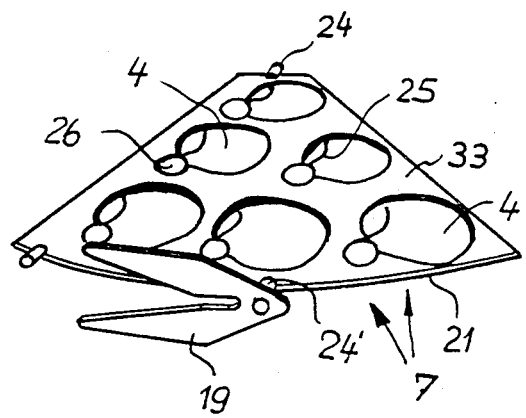
FIG. 4 is a schematic diagrammatic enlarged perspective view of a support plate according to my invention with pivoting means.

In FIG. 4 a planar circular segment-shaped support plate 33 is seen in detail with six openings 4 with a nontiltable substrate holder 7 and with the pivot cam means 19.

Figure 3:
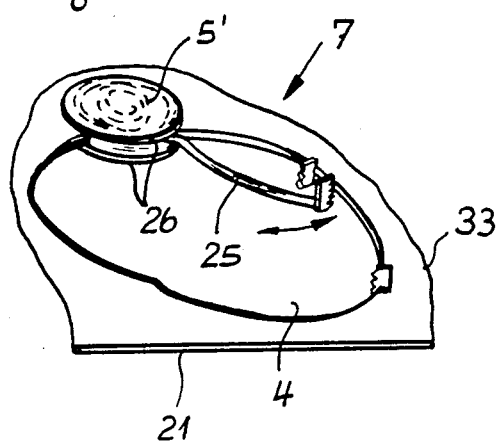
FIG. 3 is a schematic diagrammatic enlarged perspective view of a different substrate holder on a support plate in the vacuum vapor deposition apparatus according to FIG. 1.

A suitable nontiltable substrate holder 7 is shown enlarged in FIG. 3 which comprises a definite edge portion of an opening 4 in the support plate 33 for support of an unshown substrate on which the substrate then sits held by a grip arm 25 acted on by tension providing spring 5'.

This tension providing spring 5' is engaged with the inner end of the grip arm 25. The spiral spring braced on the support plate 33 is covered on both sides by circular plates 26.

Alternatively to attain a practically complete fit of the surfaces for all substrates to be coated on the support means to the ideal shape of a cup inspite of the use of planar support plates according to my invention appropriately those substrates which do not extend in their clamped position tangentially to the ideal cup curve can be tilted into the tangential position.

Figure 2:
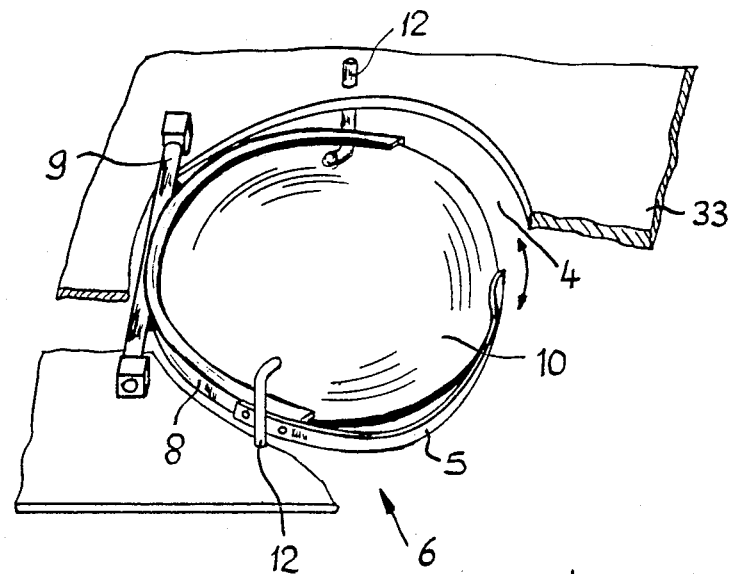
FIG. 2 is a schematic diagrammatic enlarged perspective view of a freely tiltable substrate holder for the vacuum vapor deposition apparatus according to FIG. 1.

To accomplish that as shown in FIG. 2 the substrate holder 6 mounted in the support plate 33 is freely tiltable out from the support plate plane to a predetermined angle.

FIG. 2 shows in detail this freely tiltable substrate holder 6 with a frame 8 partially surrounding the substrate 10 in which the substrate 10 sits held or acted on by a retaining spring 5. Thus the frame 8 together with the retaining spring 5 is mounted in the support plate 33 freely tiltable inwardly on both sides about a tilt axle 9. To bound or limit the tilting of the frame 8 and thus of the particular substrate 10 on both sides of it adjustable stop elements 12 in the form of angular pins are mounted on the support plate 33.

This arrangement is of a simple reliable concept which guarantees that the substrates tilt by themselves into a predetermined angular position on pivoting the support plate to attain a uniform coating on all substrates.

Naturally variations are possible in the previously described apparatus within the scope of my invention.

The above named stop elements 12 also can be located directly on the frame 8 adjacent the tilting axle 9. Further the support plates can be exclusively equipped with freely tiltable substrate holders.

I claim;

1. In a vacuum vapor deposition apparatus for coating a plurality of optical substrates such as plastic spectacle lenses which are distributed on a support means which rotates in an evacuable container above at least one vapor source, the improvement wherein said support means includes a plurality of at least approximately circular segment-shaped flat support plates which are positionable cup-like relative to each other and are supported on a common rotating axle, each pivotable about 180°, each of said support plates having a plurality of substrate holders provided in openings formed in said support plates with at least one respective retaining or tension providing spring retaining each of said substrates in a respective one of the openings, of which at least one of said substrate holders is tiltable freely on both sides thereof from the plane of said support plate to a predetermined angle.

2. The improvement according to claim 1 wherein each freely tiltable one of said substrate holders has a frame partially embracing one of said substrates received therein in which said substrate sits acted on by said retaining spring and which is mounted freely tiltable to both of said sides in said support plate on a tilting axle.

3. The improvement according to claim 2 wherein said frame cooperates with adjustable stop elements on said support plate on opposite sides of said frame for limiting angular displacement thereof.

4. The improvement according to claim 1 wherein each of said support plates is supported in the vicinity of a lower edge thereof on a ring rotating with said rotating axle and supports a pivot cam means positioned adjacent or on said lower edge which cooperates with a positioning pin temporarily movable into the rotating region of said support plate for camming of the cam means by the pin to angularly displace the support plate.

5. The improvement according to claim 1 wherein each of said substrate holders for support of said substrate includes a certain edge region of said opening of said support plate on which said substrate sits acted on by a grip arm acted on by said tension providing spring, said tension providing spring engaged on an inner end of said grip arm is a spiral spring braced on said support plate which is covered on both sides by a circular plate.

6. A vacuum vapor deposition apparatus for coating a plurality of optical substrates such as plastic spectacle lenses comprising:
an evacuable container;
at least one vapor source located in said evacuable container;
a support means on which said optical substrates are distributed which rotates in said evacuable container above said vapor source, said support means comprising:
a plurality of at least approximately circular segment-shaped flat support plates which are positionable cup-like relative to each other and are supported on a common rotating axle, each pivotable about 180°, each of said support plates being supported in the vicinity of a lower edge thereof on a ring rotating with said rotating axle and supporting a pivot cam means on said lower edge which cooperates with a positioning pin temporarily movable into the rotating region of said support plate for camming of the cam means by the pin to angularly displace the support plate; and
a plurality of substrate holders each provided in an opening in one of said support plates with at least one retaining spring retaining each of said substrates in a respective opening, of which at least one of said substrate holders is tiltable freely on both sides thereof from the plane of said support plate to a predetermined angle and has a frame partially surrounding one of said substrates received therein in which said substrate sits acted on by said retaining spring and which is mounted freely tiltable to both of said sides in said support plate on a tilting axle, wherein said frame cooperates or acts together with a plurality of adjustable stop elements on said support plate on opposite sides of the frame for limiting angular displacement of the frame on the support plate.

* * * * *